(12) United States Patent
Furuyama et al.

(10) Patent No.: US 7,554,806 B2
(45) Date of Patent: Jun. 30, 2009

(54) INTERFACE MODULE-MOUNTED LSI PACKAGE

(75) Inventors: Hideto Furuyama, Yokohama (JP); Hiroshi Hamasaki, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/779,964

(22) Filed: Jul. 19, 2007

(65) Prior Publication Data

US 2008/0192433 A1 Aug. 14, 2008

Related U.S. Application Data

(60) Continuation of application No. 11/496,446, filed on Aug. 1, 2006, now Pat. No. 7,330,352, which is a division of application No. 10/920,365, filed on Aug. 18, 2004, now Pat. No. 7,154,751.

(30) Foreign Application Priority Data

Aug. 19, 2003 (JP) ............................. 2003-295418

(51) Int. Cl.
*H05K 7/20* (2006.01)
(52) U.S. Cl. ................. 361/704; 361/695; 361/697; 361/715; 257/706; 257/721; 257/722; 165/80.3
(58) Field of Classification Search .................. 361/704
See application file for complete search history.

(56) References Cited

U.S. PATENT DOCUMENTS

| | | | |
|---|---|---|---|
| 5,894,882 A * | 4/1999 | Kikuchi et al. ............. | 165/80.3 |
| 6,172,416 B1 | 1/2001 | Miyahara et al. | |
| 6,256,201 B1 * | 7/2001 | Ikeda et al. ................. | 361/704 |
| 6,351,382 B1 | 2/2002 | Nakanishi et al. | |
| 6,552,906 B2 * | 4/2003 | Kanada ...................... | 361/705 |
| 6,750,536 B2 | 6/2004 | Stewart | |
| 6,816,377 B2 * | 11/2004 | Itabashi et al. .............. | 361/704 |

(Continued)

FOREIGN PATENT DOCUMENTS

JP 10-173114 6/1998

(Continued)

OTHER PUBLICATIONS

Jerome Eichenberger, et al., "Multi-Channel Optical Interconnection Modules Up to 2.5Gb/s.ch", IEEE, 2001 Electronic Components and Technology Conference, Proceedings, pp. 880-885.

(Continued)

*Primary Examiner*—Boris L Chervinsky
(74) *Attorney, Agent, or Firm*—Oblon, Spivak, McClelland, Maier & Neustadt, P.C.

(57) ABSTRACT

An interface module-mounted LSI package has an interposer equipped with a signal processing LSI, an interface module for signal transmission, mechanically connected to the interposer and electrically connected to the signal processing LSI, and a heat sink which is in contact with both the signal processing LSI and the interface module, and radiates heat of the signal processing LSI and the interface module. The LSI package has a gap, which serves as a heat resistor portion between the heat radiating portion for the signal processing LSI and the heat radiating portion for the interface module.

19 Claims, 5 Drawing Sheets

U.S. PATENT DOCUMENTS

| | | | |
|---|---|---|---|
| 6,861,750 | B2 | 3/2005 | Zhao et al. |
| 6,879,488 | B2 | 4/2005 | Takeda et al. |
| 6,982,877 | B2 * | 1/2006 | Vinson et al. ............... 361/719 |
| 2002/0008963 | A1 | 1/2002 | DiBene et al. |
| 2003/0081389 | A1 | 5/2003 | Nair et al. |
| 2004/0190260 | A1 * | 9/2004 | Sasaki ..................... 361/704 |
| 2006/0037741 | A1 * | 2/2006 | Tokuhira et al. ............ 165/185 |
| 2006/0268527 | A1 | 11/2006 | Tanaka et al. |

FOREIGN PATENT DOCUMENTS

| | | |
|---|---|---|
| JP | 11-352362 | 12/1999 |
| JP | 2002-289750 | 10/2002 |

OTHER PUBLICATIONS

Takashi Yoshikawa, et al., "Optical-Interconnection as an IP Macro of a CMOS Library", Hot Interconnects 9, Symposium on High Performance Interconnects, IEEE, 2001, pp. 31-35.

* cited by examiner

INTERFACE MODULE-MOUNTED LSI PACKAGE

CROSS-REFERENCE TO RELATED APPLICATIONS

This application is a Continuation of and claims the benefit of priority under 35 U.S.C. §120 to U.S. Ser. No. 11/496,446, filed Aug. 1, 2006, which is a Divisional of U.S. Ser. No. 10/920,365, filed Aug. 18, 2004, and claims the benefit of priority under 35 U.S.C. §119 from Japanese Patent Application No. 2003-295418, filed Aug. 19, 2003, the entire contents of each which are incorporated herein by reference.

BACKGROUND OF THE INVENTION

1. Field of the Invention

The present invention relates to an interface module-mounted LSI package having a high-speed interface module for signal transmission for transmitting a high-speed signal to external wiring, and a heat sink for use in the package. The present invention also relates to an interface module with a heat sink.

2. Description of the Related Art

In recent years, a structure has been proposed, in which an interface module for transmitting/receiving an optical signal to/from an external device is directly mounted on an interposer equipped with a signal processing LSI (Hot Interconnects 9. Symposium on High Performance Interconnects, IEEE, pp. 31-35, 2001, and Nikkei Electronics No. 810, pp. 121-122, Dec. 3, 2001). In this structure, there is a great difference in height between the signal processing LSI and the interface module. Further, since the interface module has an optical connector on the side (rear side) facing in the direction of heat radiation by the signal processing LSI, the interface module and the signal processing LSI cannot radiate heat in the same direction. Therefore, it is difficult to efficiently cool the signal processing LSI and the interface module by one heat sink.

In another known structure, a heat sink of a package, comprising a number of LSI chips, is divided into a plurality of parts (Jpn. Pat. Appln. KOKAI Publication No. 10-173114). In the case of using such divided heat sinks, many parts are required and the assembly cost is high. Moreover, there is a high possibility of defective modes, such as imperfect assembly of the heat sinks (misalignment). Therefore, an increase in cost due to reduction in production or assembly yield is unavoidable.

As described above, according to the conventional art, in the case where the signal processing LSI and the optical interface module are mounted on one interposer, it is difficult to efficiently cool them by one heat sink. If a plurality of heat sinks are used, the production or assembly yield is lowered, resulting in increase in cost.

BRIEF SUMMARY OF THE INVENTION

According to an aspect of the present invention, there is provided an LSI package comprising:

an interposer having a main surface;

a signal processing LSI mounted on the main surface of the interposer;

an interface module for signal transmission, mechanically connected to the interposer and electrically connected to the signal processing LSI; and a heat sink in contact with both the signal processing LSI and the interface module, the heat sink having a first heat radiating portion which is brought into contact with the signal processing LSI, a second heat radiating portion which is brought into contact with the interface module, and a heat resistor portion provided between the first and second heat radiating portions.

According to another aspect of the present invention, there is provided a heat sink comprising:

a plurality of heat radiating portions, respectively having heat receiving surfaces, which are brought into contact with and individually cool different bodies whose heat is to be radiated; and a heat resistor portion formed between adjacent two of the plurality of heat radiating portions, the heat resistor portion being provided to give a high heat resistance there between.

According to still another aspect of the present invention, there is provided a heat sink-mounted interface module comprising:

a heat sink having: first and second heat radiating portions, respectively having heat receiving surfaces, which are brought into contact with and individually cool different bodies whose heat is to be radiated; and a heat resistor portion formed between the first and second heat radiating portions, the heat resistor portion being provided to give a high heat resistance therebetween; and an interface module for signal transmission, provided in contact with the heat receiving surface of the second heat radiating portion.

DETAILED DESCRIPTION OF THE INVENTION

An interface module-mounted LSI package (Japanese Patent Application No. 2003-39828), which the present inventors proposed, will be described with reference to FIGS. 9 and 10, before describing embodiments of the present invention. In this package, for example, optical wiring is used as external wiring of a high-speed interface module.

Figure 9:
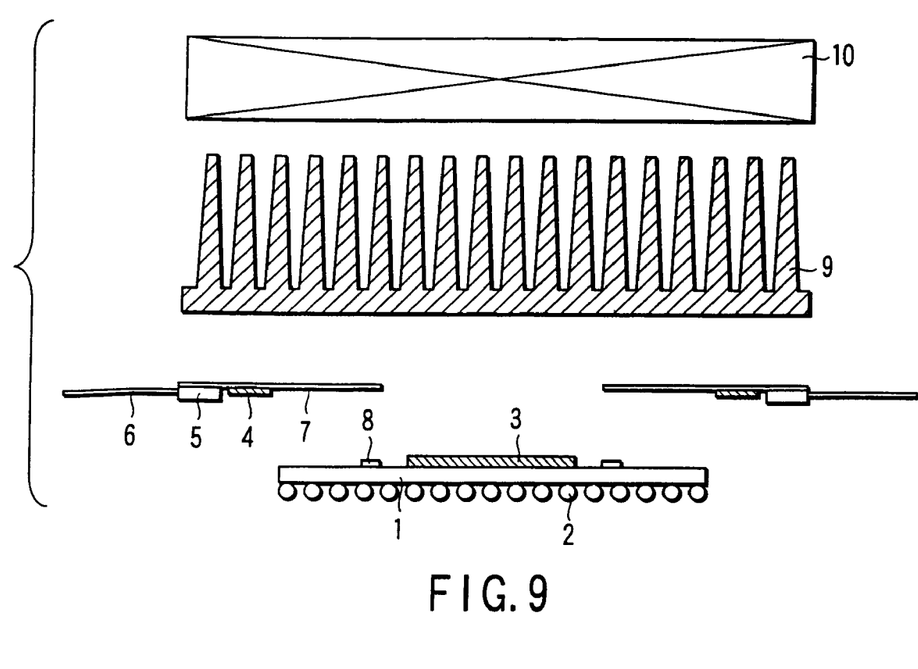
FIG. 9 is a sectional view showing a schematic structure of an interface module-mounted LSI package, which the present inventors proposed before.

In FIG. 9, the reference numerals denote the elements as follows: 1 an interposer board; 2 a solder ball; 3 a signal processing LSI; 4 an optical element driving IC; 5 an optoelectronic conversion portion; 6 an optical fiber; 7 a wiring board; 8 an anisotropic conductive film; 9 a heat sink; and 10 a cooling fan. A high-speed signal from the signal processing LSI 3 is not supplied to a mount board through the solder balls 2, but supplied to the optical element driving IC 4 through the anisotropic conductive film 8 and the wiring board 7. The high-speed signal is converted by the optoelectronic conversion portion S to an optical signal, which is supplied to the optical fiber 6. The interposer serves to connect a semiconductor chip to a motherboard or the like in an IC package. It may be a lead frame, a TAB tape, a resin board, etc.

Figure 10:
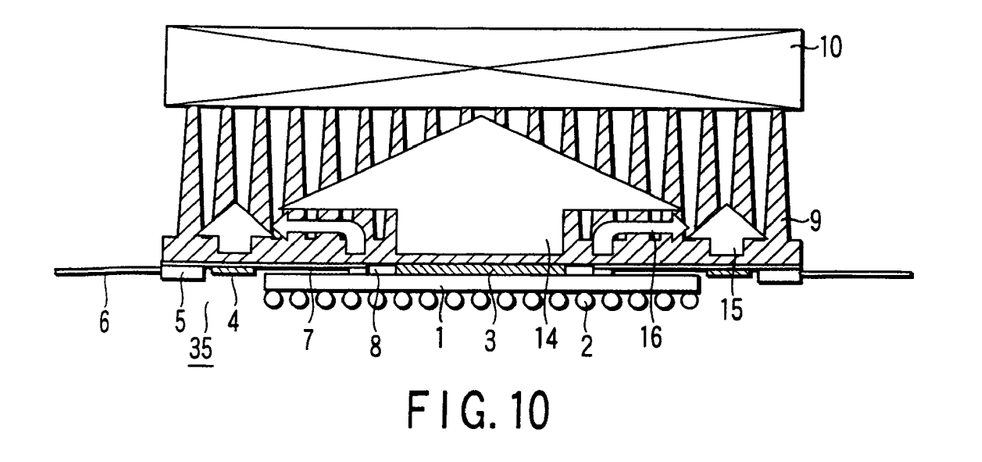
FIG. 10 is a sectional view illustrating a heat flow in the interface module-mounted LSI package shown in FIG. 9.

FIG. 10 schematically shows a complete form of the interface module-mounted LSI package the shown in FIG. 9, and heat flows during an operation time. The uppermost surfaces of the signal processing LSI 3 and the interface module 35 (the optical element driving IC 4, the optoelectronic conversion portion 5 and the wiring board 7) are at substantially the same height from the interposer board 1. The signal processing LSI 3 and the interface module 35 closely adhere to the lower surface of the heat sink 9 via heat conductive grease or the like. Reference numerals 14 to 16 show heat flows: 14 a heat flow from the signal processing LSI 13; 15 a heat flow from the optical element driving IC 4; and 16 a heat flow from the signal processing LSI 3 to the optical element driving IC 4.

The signal processing LSI 13 generally generates a large amount of heat, because it operates at a high speed. For example, a recent CPU operable at 1-3 GHz and having a size of about 10 mm×10 mm consumes power as high as 50-70 W (50-70 W/cm$^2$). On the other hand, the optical element driving IC 4, having a size of about 2 mm×2 mm, consumes relatively small power, less than 1 W (less than 20 W/cm$^2$), in the case of about 40 Gbps (10 Gbps×4 ch) throughput. Therefore, when the signal processing LSI 3 and the optical element driving IC 4 are to be cooled by the heat sink 9 alone, the heat flow 16 from the signal processing LSI 3 to the optical element driving IC 4 occurs, as shown in FIG. 10, because the signal processing LSI 3 consumes considerably high power in terms of the absolute power consumption and the power consumption density. As a result, the optical element driving IC 4 cannot be cooled. This problem frequently arises.

Therefore, it was necessary to individually cool the signal processing LSI and the optical element driving IC (main heating portion of the interface module) by divided heat sinks as disclosed in Jpn. Pat. Appln. KOKAI Publication No. 10-173114. In the case of using such a divided heat sink, many parts are required and the assembly cost is high. Moreover, there is a high possibility of defective modes, such as imperfect assembly of the heat sinks (misalignment) Therefore, an increase in cost due to reduction in manufacturing and assembly yield is unavoidable.

To overcome the above drawback, the present inventors propose a structure, in which the signal processing LSI and the interface module, mounted on one interposer, are efficiently cooled by one heat sink without involving a large-scaled structural change or complication of the structure.

An embodiment of the present invention will be described below with reference to the accompanying drawings. In the following descriptions, optical wiring is used as external wiring of a high-speed interface module. However, it may be replaced with electric wiring, such as a compact coaxial cable. In the case of electric wiring, high-speed wiring interface ICs, e.g., a line driver and a line receiver, are used instead of the optical element driving IC and the optical element. If necessary, a pre-emphasis circuit, an equalizer circuit, etc., may be included in the interface module.

FIRST EMBODIMENT

Figure 1:
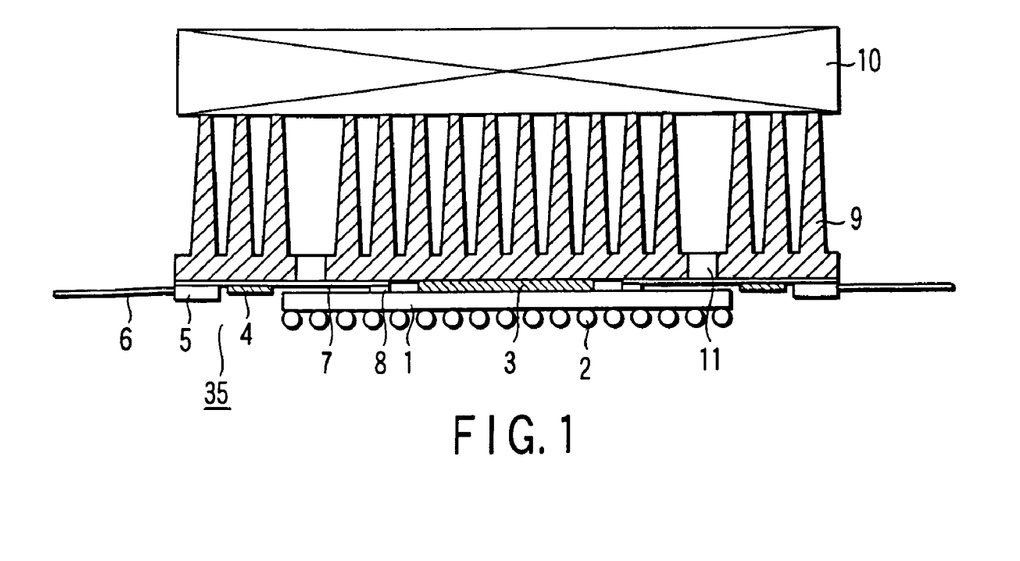
FIG. 1 is a sectional view showing a schematic structure of an interface module-mounted LSI package according to a first embodiment of the present invention.

FIG. 1 is a sectional view showing a schematic structure of an interface module-mounted LSI package according to a first embodiment of the present invention.

In FIG. 1, the reference numerals denote the elements as follows: 1 a BGA (Ball Grid Array) interposer board; 2 a solder ball; 3 a signal processing LSI; 4 an optical element driving IC; 5 an optoelectronic conversion portion; 6 an optical fiber; 7 a wiring board; 8 an anisotropic conductive film; 9 a heat skink; and 10 a cooling fan.

The BGA interposer board 1 may be of another electrode type: for example, it may be replaced by a PGA (Pin Grid Array) interposer board or an LGA (Land Grid Array) interposer board. Hereinafter, the BGA interposer board is simply referred to as an interposer board. The optoelectronic conversion portion 5 incorporates a semiconductor laser and a light receiving element optically coupled with an optical fiber. An electrode is drawn cut of the optoelectronic conversion portion 5 and connected to the optical element driving IC 4. Alternatively, the optical element driving IC 4 may be incorporated within the optoelectronic conversion portion 5. The optical element driving IC 4, the optoelectronic conversion portion 5 and the wiring board 7 are called an optical interface module 35.

In FIG. 1, a reference numeral 11 denotes a gap 11 provided in the heat sink 9. The gap 11 forms a heat resistor portion to thermally isolate an LSI heat radiating portion for the LSI (the central portion of the figure) from a heat radiating portion for the interface module (the left or right portion of the figure). The heat sink 9 is integrally formed of the heat radiating portion for the signal processing LSI 13 (first heat radiating portion) and the heat radiating portion for the interface module 35 (second heat radiating portion). Parts of the two heat radiating portions are coupled with each other. This structure will be described with reference to FIG. 2.

Figure 2:
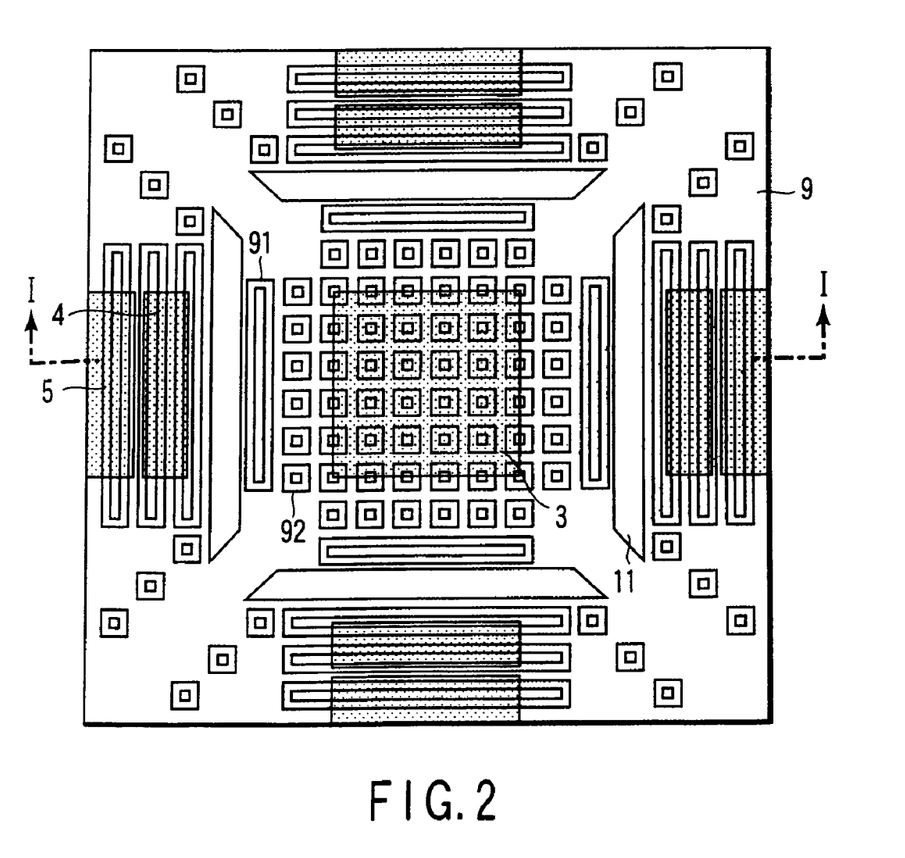
FIG. 2 is a plan view showing the structure of a heat sink of the first embodiment.

FIG. 2 is a top view of the heat sink 9 used in the first embodiment. The arrangement of the signal processing LSI 3, the optical element driving IC 4 and the optoelectronic conversion portion 5 is shown in a transparency. FIG. 1 corresponds to the cross section taken along the line I-I in FIG. 2.

In this embodiment, the heat sink 9 is of the mixture heat radiating type, using fins 91 and pins 92. A double rectangle in FIG. 2 represents a top portion and a bottom portion of each fin 91 and a double square represents a top portion and a bottom portion of each pin 92. The gap (heat resistor portion) 11 is formed by thinning out the fins 91, i.e., eliminating a part of the linear thermal conductive path between the signal processing LSI 3 and the optical element driving IC 4. In other words, the heat resistor portion 11 is provided to cut the linear thermal conductive path between the signal processing LSI 3 and the optical element driving IC 4. The heat sink 9 is manufactured by the conventional method for producing a heat sink, for example, extrusion molding and stamping of aluminum.

In FIG. 2, the heat radiating pins 92 are provided in the heat radiating portion for the interface module 35. In the heat radiating portion for the signal processing LSI 3, the heat radiating pins 92 are arranged in a central portion excluding the outermost portion, and the heat radiating fins 91 are arranged in the outermost portion. The purpose of this arrangement is to protect the interface module portion from heat of warm air (the air blown from the cooling fan 10 that has cooled the LSI). In other words, the fins 91 in the outermost portion of the heat radiating portion for the signal processing LSI 13 serve as obstacle plates, which prevent the air that has cooled the signal processing LSI 3 from blowing to the interface module side, but let it blow into space between the interface modules (corner portions of the heat sink). With this structure, not only the gap 11 prevents heat from transmitting through the heat sink materials, but also the heat radiating fins 91 in the outermost portion prevent heat transmission by forced convection.

The above description concerns the case in which the cooling fan 10 blows air toward the heat sink 9 side. However, the same effect is obtained in the case where the air flows from the heat sink 9 to the cooling fan 10. More specifically, the fin 91 serves as an airflow-restricting portion to effectively cool a bridging portion between the gaps 11 of the heat sink 9. Thus, it suppresses heat interference from the signal processing LSI 3 to the interface module 35 through the bridging portion. It is necessary that the fins 91 be arranged in the innermost portion of the heat radiating portion for the interface module; that is, the fins 91 in the other portions may be replaced by pins 92. Further, the cooling fan 10 may be omitted, if the heating value of the signal processing LSI 3 is small.

Figure 3:
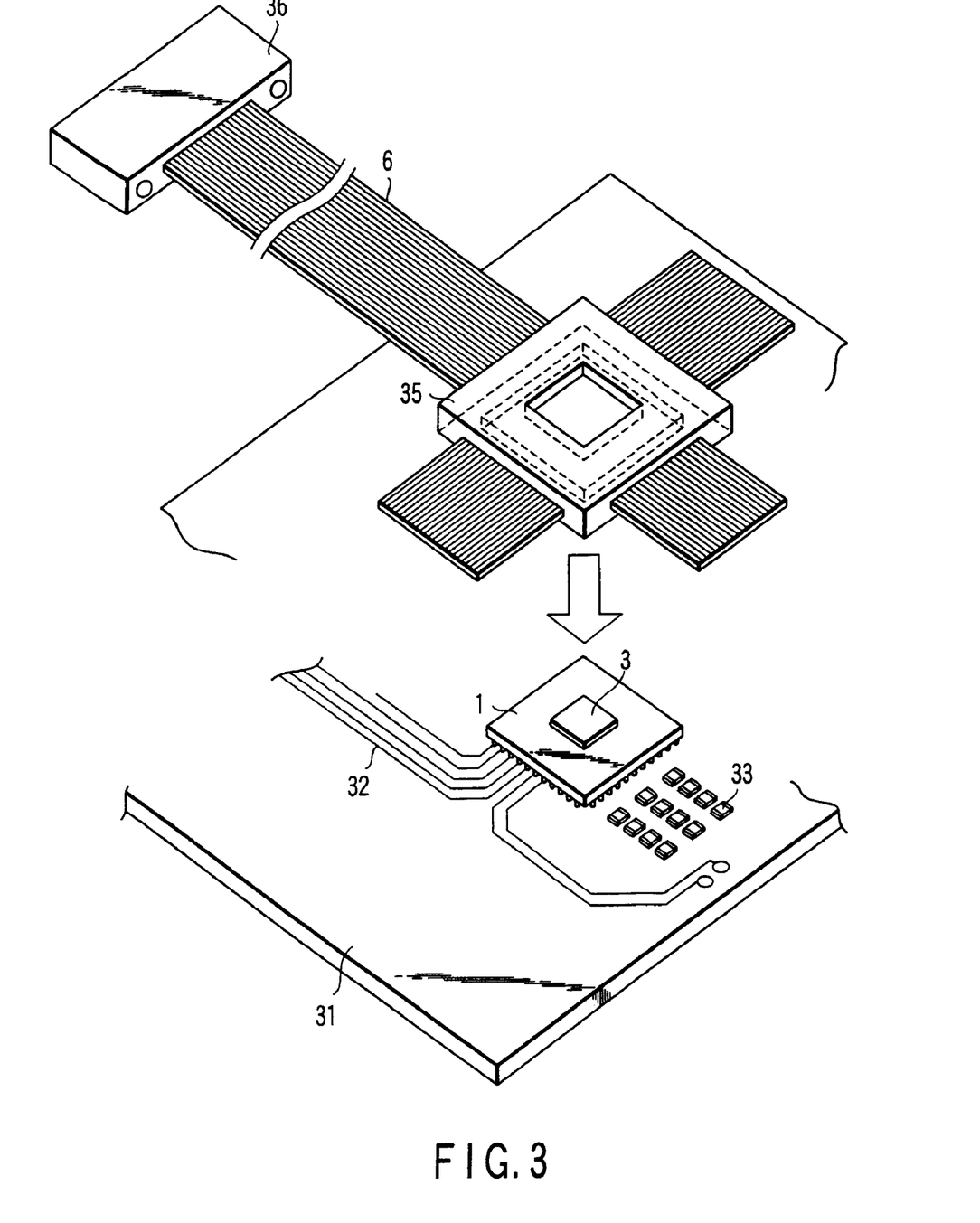
FIG. 3 is a perspective view showing the positional relationship among an interface module, a signal processing LSI and an interposer board of the first embodiment.

FIG. 3 is a perspective view showing an actual mounting state of the LSI package comprising the interface module of the above embodiment. The interposer 1, equipped with the signal processing LSI 3 and other components, is mounted on a mount board 31. Thereafter, the optical interface module 35 and the heat sink 9 (not shown in FIG. 3) are mounted on the interposer 1. Thus, the LSI package is completed. Wiring 32 and chip components 33 are mounted on the mount board 31. Further, an optical connector 36 to be connected with an external optical fiber is connected to the optical fiber 6 at the end opposite to the optical interface module 36.

This embodiment, as described above, has the structure in which the signal processing LSI 3 and the optical interface module 35 are at substantially the same height and cooled by the one heat sink 9 in contact with them. Further, the heat resistor portions 11 are formed in the heat sink 9, so that the heat sink 9 is divided into two areas: the heat radiating portion (first heat radiating portion) for the signal processing LSI 3 and the heat radiating portion (second heat radiating portion) for the interface module 35. The heat resistance value of the heat resistance portions 11 is higher than that of the first or second heat radiating portion.

The above structure prevents the drawback that the heat from the signal processing LSI 3 is transmitted to the interface module 35, resulting that the interface module 35 cannot be sufficiently cooled. In other words, the single heat sink 9 suffices to effectively cool both the signal processing LSI 3 and the interface module 35. Therefore, the signal processing LSI and the interface module 35 can be effectively cooled without involving a large-scaled structural change or complication of the structure. As a result, the production or assembly yield is improved, resulting in reduction in cost.

Moreover, in the above embodiment, the optical connector 36 is connected to the optical fiber at the position separated from the optical interface module 35, as shown in FIG. 3. This structure is also effective to solve the problem of limitation in mounting, which may arise in a large-sized optical connector structure.

SECOND EMBODIMENT

Figure 4:
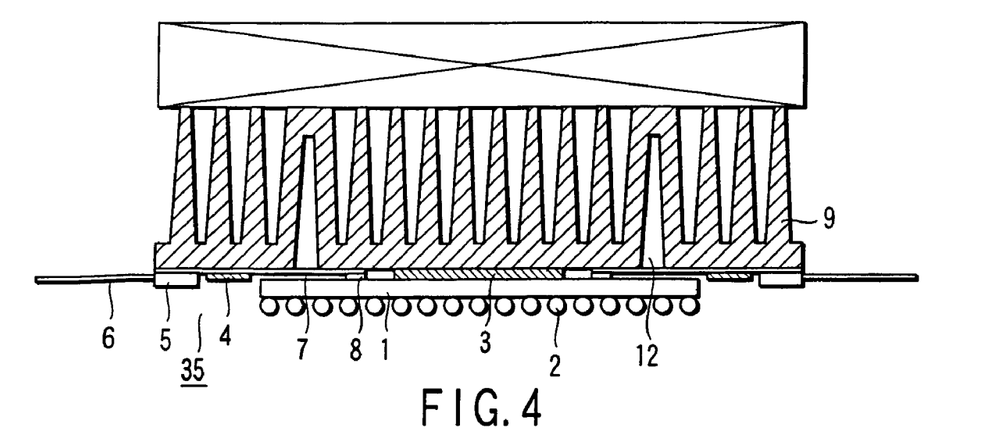
FIG. 4 is a sectional view showing a schematic structure of an interface module-mounted LSI package according to a second embodiment of the present invention.

FIG. 4 is a sectional view showing a schematic structure of an interface module-mounted LSI package according to a second embodiment of the present invention. The same components as those in FIG. 1 are identified by the same reference numerals and detailed descriptions thereof will be omitted.

The second embodiment is the same as the first embodiment, except for the heat sink structure. In FIG. 4, a reference numeral 12 denotes a groove formed by press working for producing a heat sink 9. The groove 12 serves as a heat radiating portion that thermally isolates an LSI heat radiating portion from an interface module heat radiating portion. The groove 12 extends from the bottom portion (heat receiving portion) of the heat sink 9 nearly to the top end portion thereof.

Figure 5:
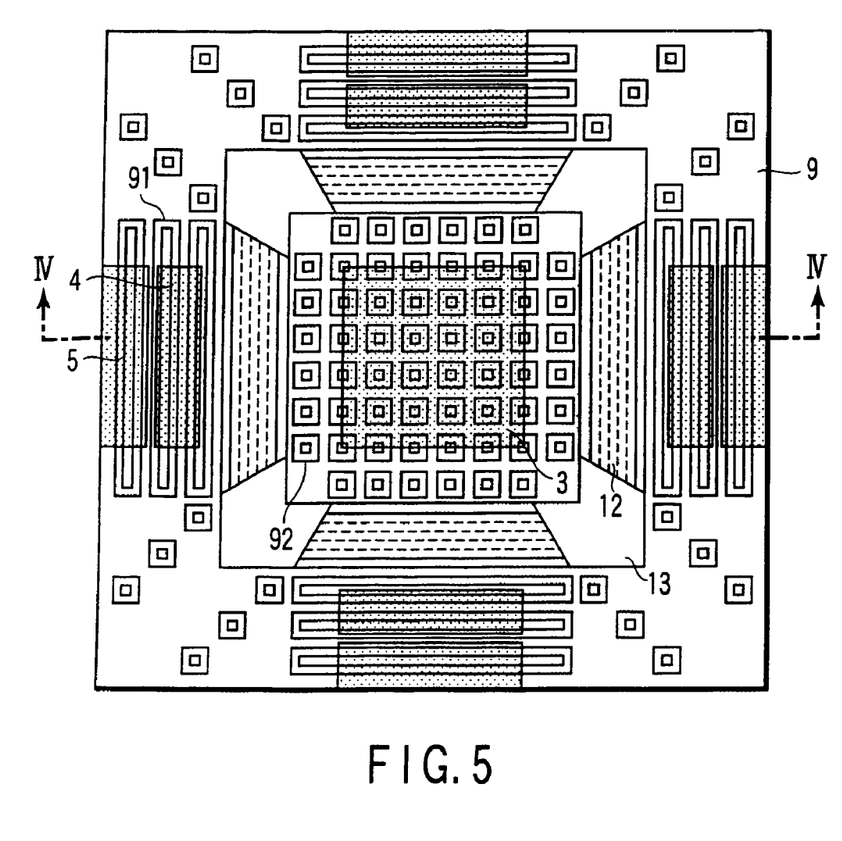
FIG. 5 is a plan view showing the structure of a heat sink of the second embodiment.

FIG. 5 is a top view of the heat sink 9 used in the embodiment shown in FIG. 4. The arrangement of the signal processing LSI 3, the optical element driving IC 4 and the optoelectronic conversion portion 5 is shown in a transparency. FIG. 4 corresponds to the cross section taken along the line IV-IV in FIG. 5.

As in the first embodiment, the heat sink 9 is of the mixture heat radiating type, using fins 91 and pins 92. The groove (heat resistor portion) 12 is provided in place of the gap 11 and the shape of the fin 91 is different from that of the first embodiment. This structure cuts the linear thermal conductive path between the signal processing LSI 3 and the optical element driving IC 4. The heat sink 9 is produced by the conventional method for producing a heat sink, for example, extrusion molding and stamping of aluminum.

Referring to FIG. 5, heat radiating fins 91, that are provided in the outermost portion of the heat radiating portion (first heat radiating portion) for the signal processing LSI 3, surround the first heat radiating portion. Heat radiating fins 91, that are provided in the innermost portion of the heat radiating portion (second heat radiating portion) for the interface module 35, are connected to the heat radiating fins 91 in the outermost portion of the first heat radiating portion on the heat radiating surface (on the cooling fan 10) opposite to the heat receiving surface.

With the above structure, the heat generated by the signal processing LSI 3 is transmitted to the interface module 35 through the low-temperature portion of the heat sink 9. Therefore, if the cooling fan 10 fully performs heat radiation, substantially no heat is transmitted from the signal processing LSI 3 to the interface module 35.

Further, in this embodiment, the heat path from the signal processing LSI 3 to the interface module 35 is longer than the heat radiating path of the LSI 3 plus the heat radiating path of the interface module 35. Therefore, the heat resistance from the signal processing LSI 3 to the interface module 35 can easily be set higher than either of the heat resistance of the LSI 3 and the heat resistance of the interface module 35.

In the sectional view of FIG. 4 showing the schematic structure, it appears that there is no exit of the air, which has cooled the heat radiating portion (central portion) of the signal processing LSI 3. However, the exit can be provided by forming a cut 13 in the groove 12 in a portion where no interface module 35 is provided (that is, a corner portion of the heat sink), as shown in FIG. 5. Moreover, in the structure shown in FIG. 5, the grooves 12 serve as obstacles, which prevent the air that has cooled the signal processing LSI 3 (warm air) from blowing to and heating the interface module side 35. Thus, the same effect as that of the embodiment shown in FIG. 2 can be obtained.

THIRD EMBODIMENT

Figure 6:
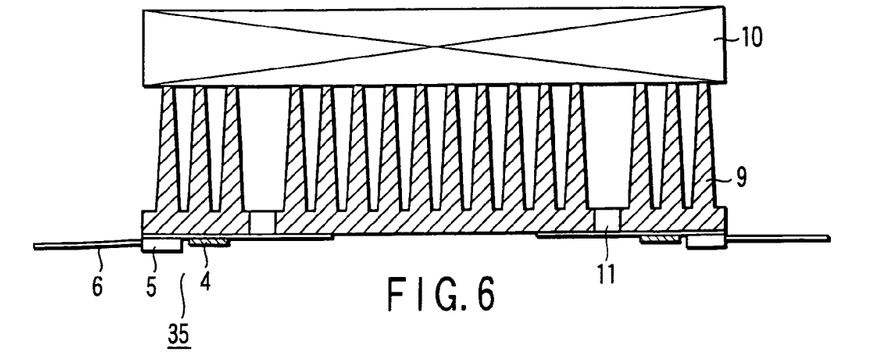
FIG. 6 is a sectional view showing a schematic structure of an interface module with a heat sink according to a third embodiment of the present invention.

FIG. 6 is a sectional view showing a schematic structure of an interface module with a heat sink according to a third embodiment of the present invention. The same components as those in FIG. 1 are identified by the same reference numerals and detailed descriptions thereof will be omitted.

In the third embodiment, an interface module 35 is attached to the heat receiving surface of a heat sink, and a cooling fan 10 is attached to the heat radiating surface thereof. Neither an interposer 1 nor a signal processing LSI 3 is connected to the heat sink. The interface module 35 is the same as that used in the first embodiment.

With this structure, the heat sink 9 with the interface module 35 is connected in alignment with an interposer 1 equipped with a signal processing LSI 3. As a result, an interface module-mounted LSI package can be produced easily. The structure of this embodiment is effective in general, because the interposer 1 is generally mounted on the mount board 31, as shown in FIG. 3.

(Modifications)

Figure 7:
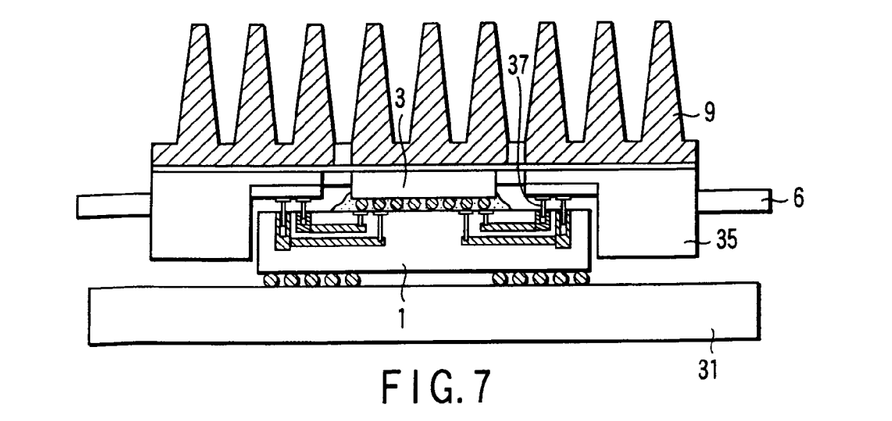
FIG. 7 is a sectional view showing a modification of the present invention.
Figure 8:
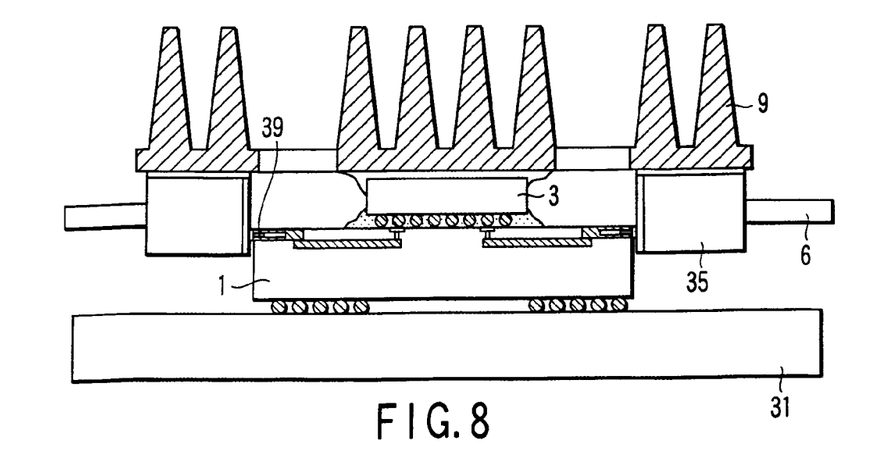
FIG. 8 is a sectional view showing another modification of the present invention.

The present invention is not limited to the above embodiments. The relationship between the signal processing LSI mounted on the interposer board and the interface module is not necessarily limited to that in the first or second embodiment. It is only necessary that the uppermost surfaces of the signal processing LSI and the interface module be at substantially the same height from the interposer board. For example, modifications as shown in FIGS. 7 and 8 are possible. In the modification shown in FIG. 7, the interface module 35 is connected to the upper surface of the interposer board 1 by a connection pin 37. In the modification shown in FIG. 8, the interface module 35 is connected to a side surface of the interposer board 1 by a connection pin 39.

The material of the heat sink 9 is not limited to aluminum, but may be copper or the like. The method for manufacturing the heat sink is not limited to molding, but may be caulking or welding.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat sink comprising:
    a plurality of heat radiating portions, having heat receiving surfaces, respectively which are brought into contact with different to-be-radiated members, respectively, to cool the different to-be-radiated members; and
    a heat resistor portion formed between adjacent two of the heat radiating portions, the heat resistor portion being provided to increase a heat resistance between the adjacent two of the heat radiating portions.

2. The heat sink according to claim 1, wherein all of the heat receiving surfaces are located on one plane.

3. The heat sink according to claim 1, wherein the heat radiating portions are integrally formed of one material.

4. The heat sink according to claim 1, wherein the heat resistor portion has a gap which cuts a linear heat path connecting the adjacent two of the plurality of heat radiating portions.

5. The heat sink according to claim 1, wherein the heat resistor portion has a groove which cuts a linear heat path connecting the adjacent two of the plurality of heat radiating portions.

6. The heat sink according to claim 1, further comprising a cooling fan fixed to the heat radiating portions.

7. The heat sink according to claim 1, wherein parts of the adjacent two of the heat radiating portions, with the heat resistor portion interposed therebetween, are connected to each other on heat radiating surfaces of the heat radiating portions which are opposite to the heat receiving surfaces.

8. The heat sink according to claim 2, wherein the heat radiating portions are integrally formed of one material.

9. The heat sink according to claim 2, wherein the heat resistor portion has a gap which cuts a linear heat path connecting the adjacent two of the plurality of heat radiating portions.

10. The heat sink according to claim 2, wherein the heat resistor portion has a groove which cuts a linear heat path connecting the adjacent two of the plurality of heat radiating portions.

11. The heat sink according to claim 2, further comprising a cooling fan fixed to the heat radiating portions.

12. The heat sink according to claim 2, wherein parts of the adjacent two of the heat radiating portions, with the heat resistor portion interposed therebetween, are connected to each other on heat radiating surfaces of the heat radiating portions which are opposite to the heat receiving surfaces.

13. A heat sink-mounted interface module comprising:
    a heat sink including a first heat radiating portion and second heat radiating portion, each having a heat receiving surface, which is brought into contact with a corresponding one of different to-be-radiated members to cool, and a heat resistor portion provided between the first heat radiating portion and the second heat radiating portion to increase a heat resistance therebetween; and
    an interface module for signal transmission, provided in contact with the heat receiving surface of the second heat radiating portion.

14. The heat sink-mounted interface module according to claim 13, wherein all of the heat receiving surfaces are located on one plane.

15. The heat sink-mounted interface module according to claim 13, wherein the heat radiating portions are integrally formed of one material.

16. The heat sink-mounted interface module according to claim 13, wherein the heat resistor portion has a gap which cuts a linear heat path connecting the adjacent two of the plurality of heat radiating portions.

17. The heat sink-mounted interface module according to claim 13, wherein the heat resistor portion has a groove which cuts a linear heat path connecting the adjacent two of the plurality of heat radiating portions.

18. The heat sink-mounted interface module according to claim 13, further comprising a cooling fan fixed to the heat radiating portions.

19. The heat sink-mounted interface module according to claim 13, wherein parts of the adjacent two of the heat radiating portions, with the heat resistor portion interposed therebetween, are connected to each other on heat radiating surfaces of the heat radiating portions which are opposite to the heat receiving surfaces.

* * * * *

UNITED STATES PATENT AND TRADEMARK OFFICE
CERTIFICATE OF CORRECTION

PATENT NO. : 7,554,806 B2  
APPLICATION NO. : 11/779964  
DATED : June 30, 2009  
INVENTOR(S) : Furuyama et al.

Page 1 of 1

It is certified that error appears in the above-identified patent and that said Letters Patent is hereby corrected as shown below:

On the title page, the Terminal Disclaimer information has been omitted. Item (45) and the Notice information should read as follows:

--(45) **Date of Patent: * Jun. 30, 2009**

( * ) Notice: Subject to any disclaimer, the term of this patent is extended or adjusted under 35 U.S.C. 154(b) by 0 days.

This Patent is subject to a terminal disclaimer.--

Signed and Sealed this

Twenty-fifth Day of August, 2009

David J. Kappos  
*Director of the United States Patent and Trademark Office*